United States Patent [19]

Seya et al.

[11] Patent Number: 4,956,813

[45] Date of Patent: Sep. 11, 1990

[54] APPARATUS FOR REGENERATING INFORMATION FROM RECORDS MADE BY OPTICAL-WAVELENGTH-MULTIPLEXING METHOD

[75] Inventors: Masatomo Seya; Kazuo Okada, both of Hyogo, Japan

[73] Assignee: Mitsubishi Denki Kabushiki Kaisha, Tokyo, Japan

[21] Appl. No.: 216,897

[22] Filed: Jul. 8, 1988

[30] Foreign Application Priority Data

Jul. 15, 1987 [JP] Japan .................................. 62-177726

[51] Int. Cl.$^5$ ............................................. G11C 13/04
[52] U.S. Cl. .................................... 365/127; 365/120
[58] Field of Search ................ 365/127, 120, 121, 124, 365/125

[56] References Cited

U.S. PATENT DOCUMENTS

| | | |
|---|---|---|
| 3,638,201 | 1/1972 | Borner . |
| 4,101,976 | 7/1978 | Castro et al. . |
| 4,139,263 | 2/1979 | Lehureau et al. . |
| 4,283,777 | 8/1981 | Curry et al. . |
| 4,428,069 | 1/1984 | Hazel et al. . |

OTHER PUBLICATIONS

U.S. application Ser. No. 140,210.
U.S. application Ser. No. 167,109.
U.S. application Ser. No. 182,118.

Primary Examiner—Terrell W. Fears
Attorney, Agent, or Firm—Wolf, Greenfield & Sacks

[57] ABSTRACT

An apparatus for reproducing information from records made by an optical-wavelength-multiplexing method which includes a first medium acting as a data carrier which data can be recorded on and reproduced from by the optical-wavelength-multiplexing method and which further includes a second medium having the same characteristic as that of the first medium on which no records have been made, wherein components of light reflected or transmitted by the first and second mediums are then detected by a first and second photodetectors, respectively, and wherein the outputs of the first and second photodetectors are further processed so that a ground level of the "reproduced signal" is adjusted to substantially constant value.

11 Claims, 5 Drawing Sheets

APPARATUS FOR REGENERATING INFORMATION FROM RECORDS MADE BY OPTICAL-WAVELENGTH-MULTIPLEXING METHOD

Presently pending U.S. patent applications, Ser. Nos. of which are 167109, 140210 and 182118 and which are assigned to the same assignee as the instant application, contain related subject matter.

BACKGROUND OF THE INVENTION

1. Field of the Invention

The present invention relates to an apparatus for regenerating information or data from a record thereof which is made by an optical-wave length-multiplexing (hereunder abbriviated as OWM) method.

2. Description of the Prior Art

FIG. 1 shows construction of a prior art apparatus for regenerating information or data from a record thereof made by the OWM method as disclosed in Japanese Patent Publication No. 51,355/83. Further, FIG. 2 illustrates a wavelength spectrum of a medium 1 on which records of information or data have been made by the OWM method.

Referring first to FIG. 1, there are shown a variable wavelength light source 1 such as a semiconductor laser, a controller 2 for regulating the wavelength of light from the light source 1, a collimating lens 3 for focusing light from the light source 1 into a parallel beam, a light deflector 4, an objective lens 5 for converging a beam of light from the light source 1 into a minute spot on a medium 6 on which data can be recorded by the OWM method and which the data can be reproduced from the record thereof, storage elements 7 (each of which is represented by a white circle in this figure) provided on the medium 6 which are properly selected by the light deflector 4, and a photodetector 8 for detecting light which has passed through the storage medium 7.

Next, operation of this apparatus will be described hereinbelow. First, paths of light rays from the light source 1 are collimated by the collimating lens 3 to produce parallel light rays which are then focused by the objective lens 5 into a spot of light which in turn is projected onto a selected one of the storage elements 7 on the medium 6 on which data can be recorded by the OWM method and which the data can be reproduced from the record thereof. The selection of desired one of the storage medium elements 7 is freely conducted by the light deflector 4. With reference to FIG. 2, the principle of the OWM method for recording and reproducing of data will be described hereinbelow. FIG. 2(a) shows an absorption spectrum of such a medium on which a record has not yet been made by the OWM method. As can be seen from this graph, this medium has a wide or broad absorption spectrum. When light having a spectrum (that is, a display of intensity of the light as a function of the wavelength of the light) as indicated by a dotted line in this graph is projected onto this medium, there are produced some drops of intensity of the absorption at the wavelength of the light thus projected, as shown in this figure. These drops of the intensity of the absorption are called "spectral holes" (hereinafter referred to simply as "holes"). When a "hole" is produced, it is supposed that data "1" is recorded at the corresponding wavelength and on the other hand, data "0" is recorded in a region of the wavelength where no "holes" are present. The formation of a hole, that is, the writing of data "1" at a given wavelength can be accomplished by adjusting the wavelength of the light from the source 1 to the given wavelength to be recorded by the use of the wavelength controller 2 and increasing the level of the intensity of the light from the source 1 up to that required for recording of the data or information. The reading of a signal from the medium on which data are recorded by the OWM method as shown in FIG. 2(b) may be effected by scanning the medium by using light of constant intensity from the light source 1 over the range of the wavelength between the upper limit A and the lower limit B of the wavelength used to record the data or information. As shown in FIG. 2(b) which shows an absorption spectrum of the medium onto which the light having the given wavelength is projected, sudden drops or falls in the absorptivity of the medium appear at the wavelengths corresponding to the "holes". Accordingly, the detection of the light, which has passed through the medium 6, effected by the photodetector 8 provides a wavelength spectrum of the medium 6 showing the relation between the intensity and wavelength of the transmitted light as shown in FIG. 2(c). If the medium 6 is scanned over the above described range of the wavelength at a constant rate in time, the photodetector 8 can output a corresponding signal (hereunder sometimes referred to simply as "reproduced signals") which represent information or data to be reproduced and strength of which varies with time.

Being constructed as above described, the prior art apparatus for producing "reproduced signals" from records made by the OWM recording is disadvantageous in that the "reproduced signal" produced from the recorded data do not have constant ground level. Therefore, the "reproduced signal" should be properly processed in such a manner to, for example, keep its ground level constant before being converted into a desired signal representing information.

The present invention is intended to solve the above-mentioned problems of the prior art. It is accordingly an object of the present invention to provide an apparatus for regenerating information or data from records made on a medium by the OWM method which can transfer information or data at a high speed.

SUMMARY OF THE INVENTION

To achieve the foregoing object and in accordance with an aspect of the present invention, there is provided an apparatus for reproducing information from records made by the OWM method which includes a first medium acting as a data carrier, which data can be recorded on and reproduced from by the OWM method, and further includes a second medium having the same characteristic as that of the first medium on which no records have been made, wherein components of the light reflected from or transmitted by the first and second mediums are then detected by a first and second photodetectors, respectively and wherein arithmetic and logical operations are performed upon the outputs of the first and second photodetectors so that a ground level of a "reproduced signal" is adjusted to a substantially constant value.

As above stated, in the apparatus of the present invention for reproducing information from records made by the OWM method, the second medium has the same intensity-wavelength characteristic as that of the first medium, if no records have been recorded on both of the first and second mediums. Thereby, the apparatus of the present invention can provide a substantially constant ground level to the "reproduced signal" by performing subtraction of the output of the second photodetector from that of the first photodetector.

BRIEF DESCRIPTION OF THE DRAWINGS

Other objects and advantages of the present invention will be understood by those of ordinary skill in the art after referring to the detailed description of a preferred embodiment of the present invention contained herein and to the accompany drawings in which like reference numerals refer to like parts and in which.

DESCRIPTION OF THE PREFERRED EMBODIMENTS

Figure 1:
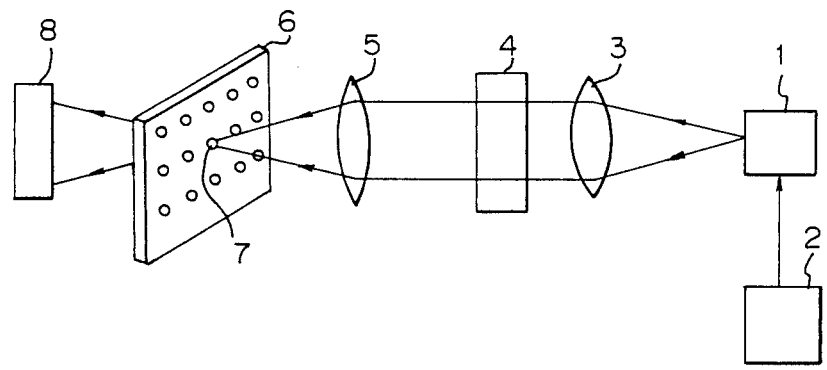
FIG. 1 is a schematic illustration showing the construction of the prior art apparatus for reproducing information from records made by the OWM method.
Figure 2:
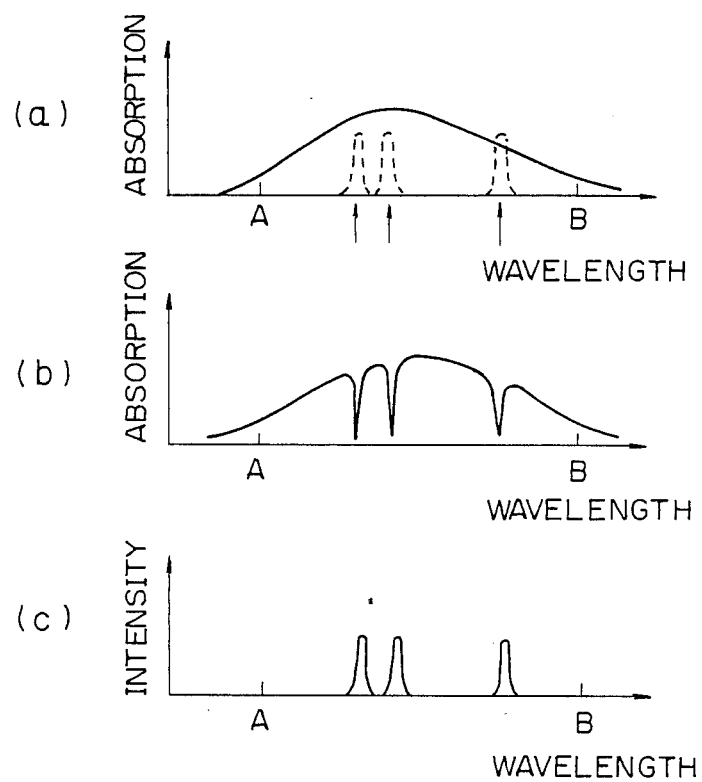
FIG. 2(a) and (b) are graphs showing wavelength spectrums of the first or second medium of FIG. 1, in cases that no data have been recorded thereon and that data have been recorded thereon, respectively.
FIG. 2(c) is a graph showing the relation between the intensity and wavelength of the light from the light source of FIG. 1.

Hereinafter, a preferred embodiment of the present invention will be described with reference to the accompanying drawings. First, in FIG. 3, reference numerals 9, 10, 11, 12 and 13 indicate a half mirror or beam splitter for separating a beam of light collimated by the collimating lens 3 into two components thereof, a shutter for intercepting one of the light components separated by the beam splitter 9, a second medium which has the same properties as the first medium 6 has, which information or data can be recorded on and reproduced from by the OWM method, and on which no records have been performed, a second photodetector for detecting light which has been separated by the beam splitter 9 and then passed through the second medium and an arithmetic logic circuit for subtracting the output of the second photodetector 8 from that of the first photodetector 12.

Figure 4:
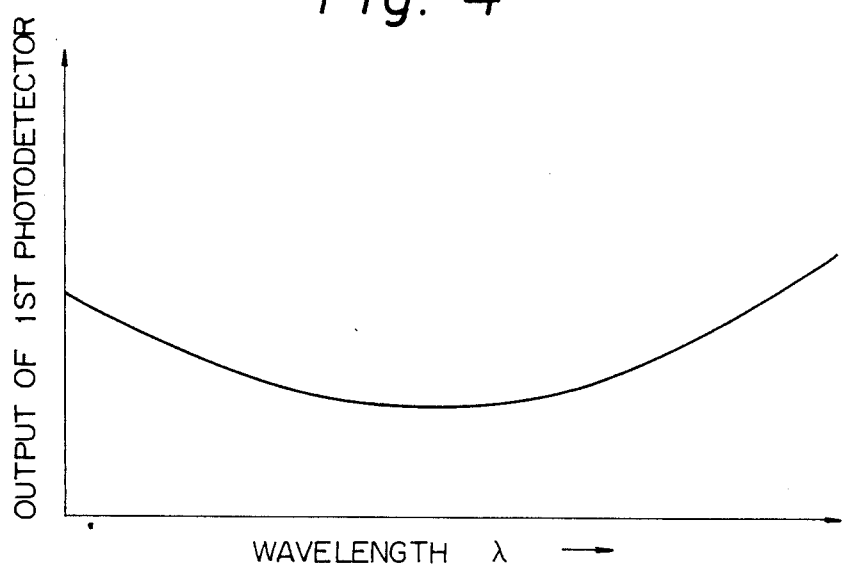
FIG. 4 is a graph showing the relation between an output of a second photodetector provided in the apparatus of FIG. 3 and the wavelength of light which passed through a second medium on which data have not been recorded.
Figure 5:
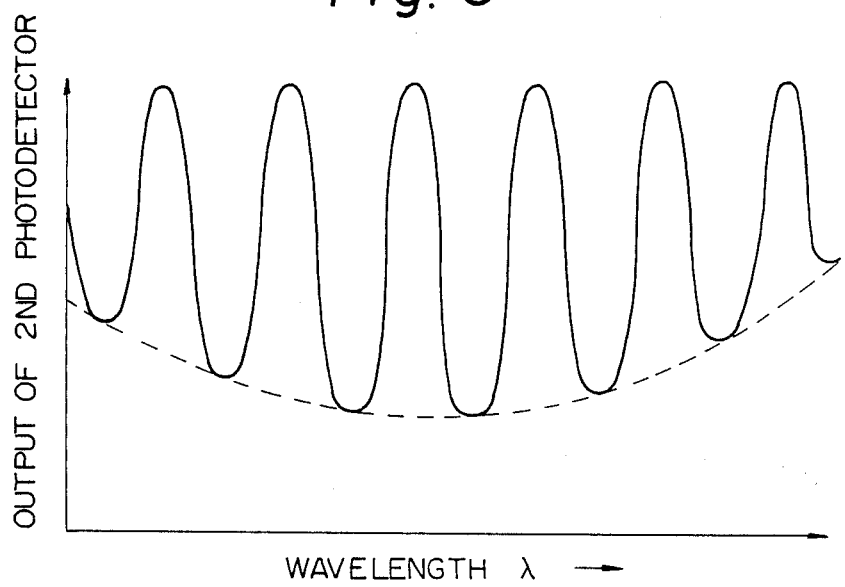
FIG. 5 is a graph showing the relation between an output of a first photodetector provided in the apparatus of FIG. 3 and the wavelength of light which passed through a first medium on which data have been recorded.
Figure 6:
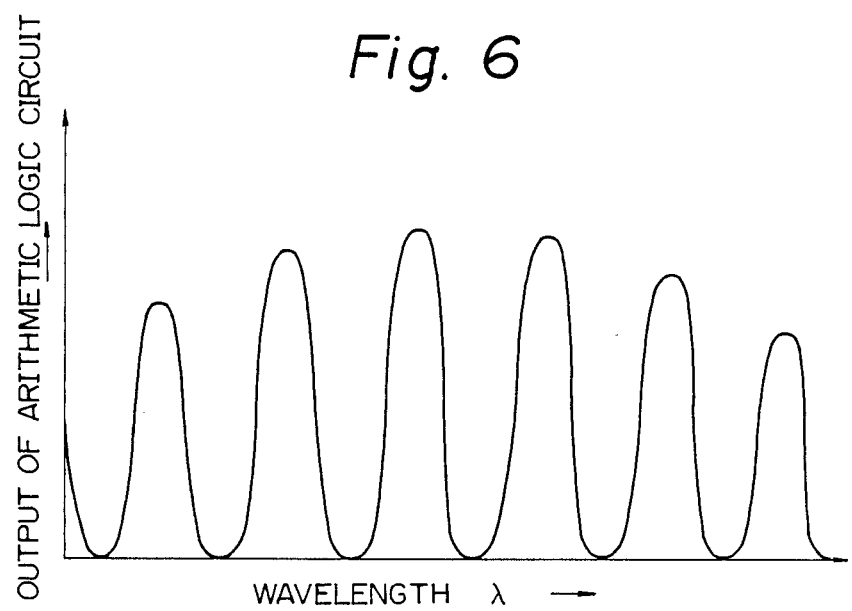
FIG. 6 is a graph showing the relation between an output of an arithmetic logic circuit, to which the outputs of the first and second photodetectors are connected as inputs thereof, and the wavelength of light from the light source of FIG. 1.

Further, FIG. 5 illustrates the output of the photodetector 8 when the wavelength of the light from the light source 1 is varied. Moreover, FIG. 4 illustrates the output of the second photodetector 12 when the wavelength of the light from the light source 1 is varied. Furthermore, FIG. 6 illustrates the output of the arithmetic logic circuit to which the outputs of the first and second photodetectors 8 and 12 are connected as inputs thereof when the wavelength of the light from the light source 1 is varied.

Figure 3:
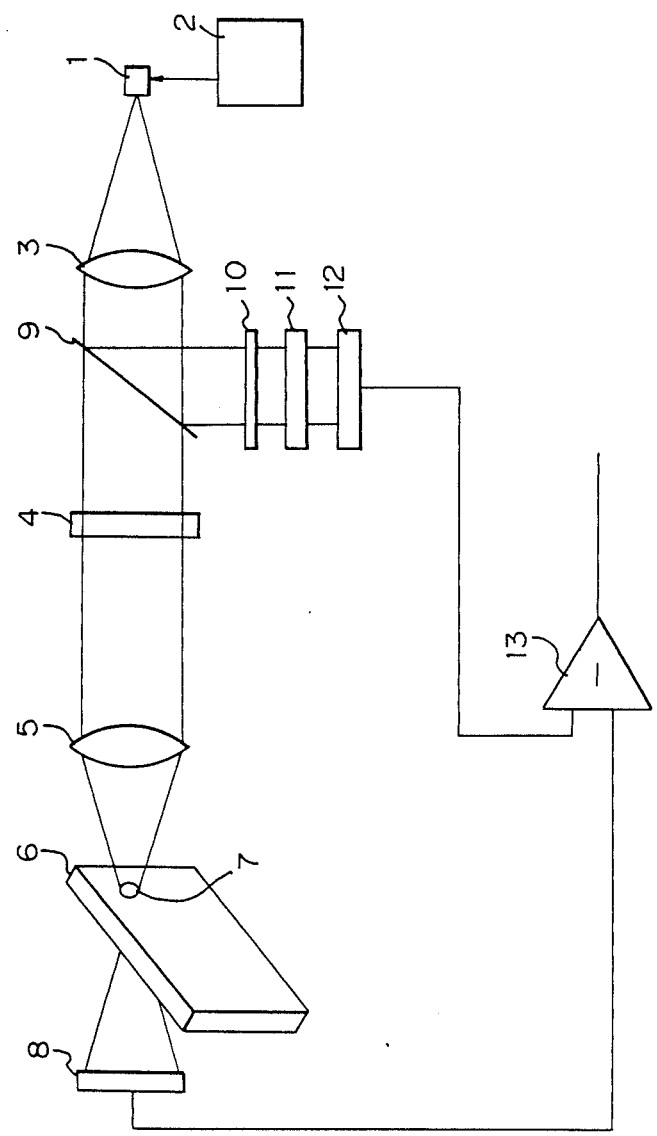
FIG. 3 is a schematic illustration showing the construction of an apparatus embodying the present invention.

Next, operation of the apparatus embodying the present invention will be described hereinafter. First, as shown in FIG. 3, the direction, along which the light from the light source 1 passes, is controlled by the light deflector 4. The light thus deflected then enters selected one of the storage elements 7 on the first medium 6. Further, the light passed through the selected one of elements 7 is then detected by the first photodetector 8. On the other hand, the remaining component of the light separated by the beam splitter 9 passes through the shutter 10 and thereafter enters the medium 11. The light which thus passed through the medium 11 is then detected by the second photodetector 12.

Figure 7:
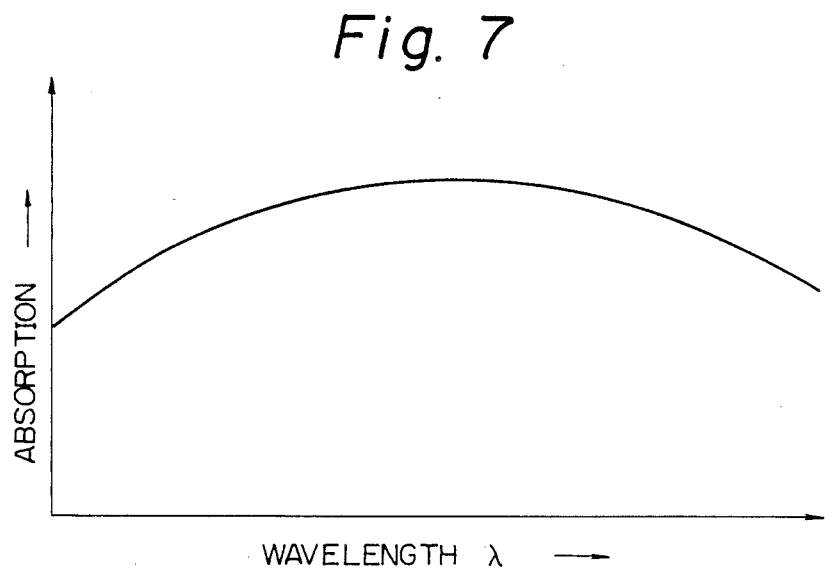
FIG. 7 is a graph which shows the wavelength spectrum indicating the absorption characteristic of the first and second media or mediums on which no records have been recorded.

Turning now to FIG. 7, there is described a graph showing wavelength absorption characteristic of the medium on which data can be recorded by the OWM method and which the data can be reproduced from the record. Accordingly, the output of the second photodetector 12 exhibits a characteristic as shown in FIG. 4 when it detects the light which has passed through the second medium 11 on which no data has been recorded. On the other hand, the medium on which data has been recorded exhibits an absorption characteristic thereof as shown in FIG. 6. Thus, the output of the first photodetector 8 exhibits a characteristic as shown in FIG. 5 when it detects the light which has passed through the first medium 6 on which records has been made.

Figure 8:
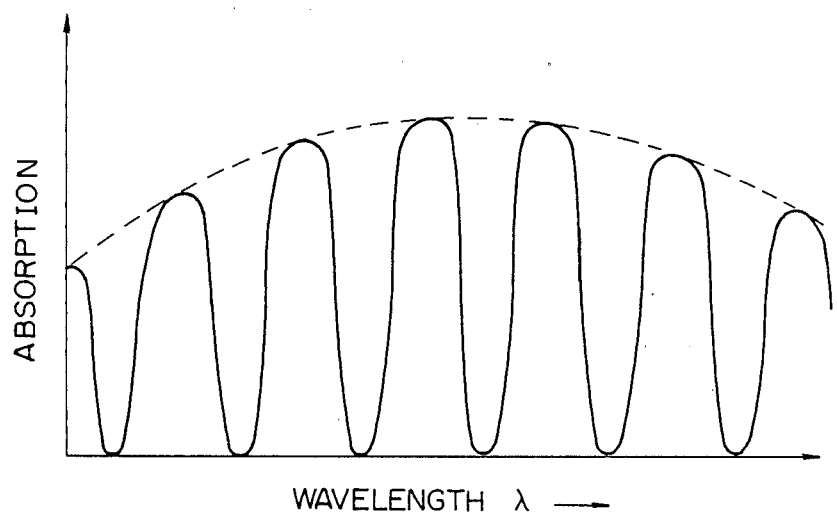
FIG. 8 is a graph which shows the wavelength spectrum indicating the absorption characteristic of the first and second mediums on which some records have been recorded.

Further, the outputs of the first and second photodetectors 8 and 12 are then subjected to the subtraction processing in the arithmetic logic circuit 13 whereby an output having a constant ground level as shown in FIG. 8 can be provided.

Further, the gain of the apparatus is automatically controlled by employing the output of the second photodetector 12 as a reference so that the apparatus of the present invention can provide a "reproduced signal" which has a constant amplitude and is referenced to a constant ground level.

In addition, the shutter 10 is adapted to prevent data from being recorded on the medium 11 on which no data has been made while records of the data is being made on the medium 6. Thereby, the apparatus of the present invention can prevent data from being written into the medium 11 on which no records have been made even while records are being made on the medium 6 by properly adjusting a value of a ratio between the amplitudes of the reflected part and the transmitted part of light with the aid of the beam splitter 9.

In accordance with the present invention, a "reproduced signal" can be provided at a constant ground and signal level from a medium, which data can be recorded on and reproduced from by the OWM, with the result that the data can be reproduced by a simple signal processing, thereby enabling reproduction of information or data at a high speed.

While the invention has been described in detail and with reference to a specific embodiment thereof, it will be apparent to those skilled in the art that various changes and modifications can be made therein without departing from the spirit and scope thereof.

What is claimed is:

1. An apparatus for regenerating information from records made by an optical-wavelength-multiplexing method, comprising, in combination:
    a variable wavelength light source for issuing light of a desired wavelength;
    beam splitting means for separating the light from said light source into first and second components thereof;
    storage means, which data can be recorded on and reproduced from by the optical-wavelength-multiplexing method, for receiving the first component of the light from said light source and for recording data thereon by producing a "spectral hole" at the wavelength of the received first component of the light and for further reflecting the first component of the light from said source or letting the first component transmit therethrough after the recording of the data;
    first detecting means for detecting the component of the light reflected or transmitted by said first storage means and for producing a first output signal representing data bit whether significant data is present at the wavelength of the first component of the light projected onto said storage means;
    reference means, which has the same intensity-wavelength characteristic as that of said storage means and which data can be recorded on and reproduced from by the optical-wavelength-multiplexing method, for receiving the second component of the light from said light source and for reflecting the second component of the light from said source or letting the second component transmit therethrough;
    second detecting means for detecting the second component of the light reflected or transmitted by said reference means and for producing a second output signal; and
    arithmetic logic circuit means for receiving the first and second output signals and for subtracting the level of the first output signal from that of the second output signal to provide a "reproduced signal" representing the data bit and reference to a constant ground level.

2. The apparatus according to claim 1 wherein the gain of the "reproduced signal" is automatically controlled by the second output signal of said second detecting means to provide a signal having a constant amplitude and referenced to a constant ground level.

3. An apparatus for regenerating information from records made by an optical-wavelength-multiplexing method, comprising, a variable wavelength light source for providing light of a desired wavelength; beam splitting means for separating the light from said light source into first and second components thereof; a first medium upon which data can be recorded and from which said data can be reproduced by the optical-wavelength-multiplexing method, for receiving the first component of the light from said light source and for recording data thereon; first detecting means for detecting the first component of light from said first medium and for producing a first output signal; a second medium which has the same intensity-wavelength characteristic as that of said first medium and upon which data can be recorded and from which said data can be reproduced by the optical-wavelength-multiplexing method, for receiving the second component of the light from said light source; second detecting means for detecting the second component of the light from said second medium and for producing a second output signal; and means for receiving the first and second output signals and for subtracting the level of the first output signal from that of the second output signal to provide a reproduced signal.

4. An apparatus according to claim 3 wherein the gain of the reproduced signal is automatically controlled by the second output signal of said second detecting means to provide a signal having a constant amplitude and referenced to a constant ground level.

5. An apparatus according to claim 3 wherein said first and second media are storage media.

6. An apparatus according to claim 3 wherein data is stored on said first medium by producing a spectral hole at the wavelength of the received first component of the light and for further reflecting the first component of the light from said source or letting the first component transmit therethrough after the recording of the data.

7. An apparatus according to claim 6 wherein the first output signal represents a data bit whether significant data is present at the wavelength of the first component of the light projected onto the first medium.

8. An apparatus according to claim 7 wherein the second medium reflects the second component of light from the source or lets the second component transmit therethrough.

9. An apparatus according to claim 3 wherein said means for subtracting includes arithmetic logic circuit means.

10. An apparatus according to claim 3 further including a shutter disposed between said beam splitting means and second medium.

11. A method for regenerating information from records made by an optical-wavelength-multiplexing method, said method comprising the steps of, providing a variable wavelength light source for providing light of a desired wavelength, separating the light from the light source into first and second components, providing a first medium upon which data can be recorded and from which said data can be reproduced by the optical-wavelength-multiplexing method, for receiving the first component of light from the light source, detecting the first component of light from the first medium and for producing a first output signal, providing a second medium which has the same intensity-wavelength characteristic as that of the first medium, and upon which data can be recorded and from which said data can be reproduced by the optical-wavelength-multiplexing method, for receiving the second component of light from the light source, detecting the second component of light from the second medium, and for producing a second output signal, and subtracting the level of the first output signal from that of the second output signal to provide a reproduced signal.

* * * * *